United States Patent [19]

Trammell, Jr.

[11] Patent Number: 4,541,311
[45] Date of Patent: Sep. 17, 1985

[54] FUSE PULLER

[75] Inventor: Earl M. Trammell, Jr., St. Louis, Mo.

[73] Assignee: Idea Pioneer, Inc., St. Louis, Mo.

[21] Appl. No.: 354,381

[22] Filed: May 3, 1982

[51] Int. Cl.4 .............................................. B25B 27/14
[52] U.S. Cl. ......................................... 81/3.8; 29/278
[58] Field of Search ............. 81/3.8; 269/254 R, 156; 294/19 R, 99 R; 29/278, 280

[56]   References Cited
U.S. PATENT DOCUMENTS

| | | | |
|---|---|---|---|
| 1,023,077 | 4/1912 | Grout | 81/3.8 |
| 1,218,109 | 3/1917 | Neeley | 81/3.8 |
| 1,429,852 | 9/1922 | Dyer et al. . | |
| 1,741,222 | 12/1929 | Brown | 294/19 R |
| 2,023,916 | 12/1935 | Dante . | |
| 2,194,831 | 3/1940 | Marshall . | |
| 2,379,433 | 7/1945 | Hemmerling . | |
| 2,794,167 | 5/1957 | Jones, Jr. . | |
| 3,100,323 | 8/1963 | Baker . | |
| 3,215,006 | 11/1965 | Urani . | |
| 3,654,824 | 4/1972 | Reed . | |
| 3,794,948 | 2/1974 | Linton et al. . | |
| 3,820,017 | 6/1974 | Reichenbach . | |
| 3,868,136 | 2/1975 | Schweitzer, Jr. | 294/19 R |
| 3,879,778 | 4/1975 | Archer . | |
| 4,094,212 | 6/1978 | Hyams et al. | 81/3.8 |
| 4,128,024 | 12/1978 | Hyams et al. . | |
| 4,175,728 | 11/1979 | Ferguson | 269/254 R |
| 4,210,862 | 7/1980 | Koslar . | |
| 4,281,322 | 7/1981 | Nasu et al. . | |
| 4,314,383 | 2/1982 | Epstein | 81/3.8 X |

OTHER PUBLICATIONS

"Fuse Monitors for Cars", *Practical Electronics,* Mar. 1976, p. 239.
"Handy Test Lamp for Checking Circuits in a Car", *Popular Mechanics,* Sep. 1944, p. 133.

*Primary Examiner*—Frederick R. Schmidt
*Assistant Examiner*—Debra S. Meislin
*Attorney, Agent, or Firm*—Rogers, Howell, Renner, Moore & Haferkamp

[57]  ABSTRACT

A fuse puller includes a central handle portion and a blade fuse fixture at one end having a pair of generally colinear tines, each tine having a barb at its end with a tab like projection extending inwardly to engage the upraised shoulder of a blade type fuse. A center stem extends between the tines and has a generally concave platform surface adapted to receive the barrel of a barrel type fuse. The other end of the tool has a generally flattened hook like projection for sliding insertion between a barrel type fuse and fuse block and pivoting movement under the end of a barrel type fuse to pry out an end thereof. The fuse puller may be a one piece injection molded structure made from a polycarbonate compound.

12 Claims, 3 Drawing Figures

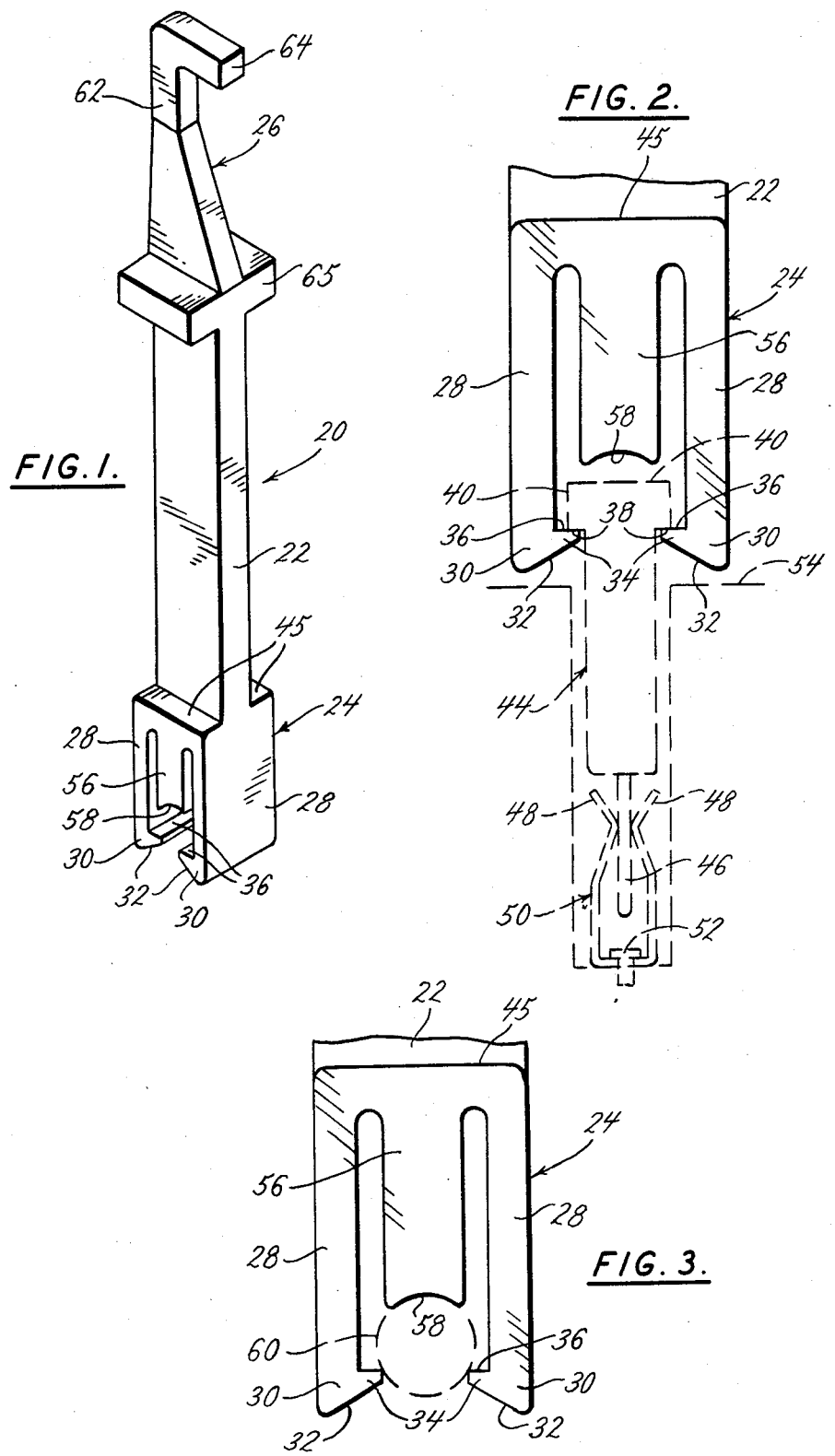

FUSE PULLER

BACKGROUND AND SUMMARY

There are a great number of applications for small barrel type fuses, and more recently blade type fuses, which are inserted into spring clip receptacles. The most common of these is in the automotive industry where virtually every vehicle includes a plastic fuse block, made from phenolic or the like, with a plurality of fuses and fuse receptacles wired into the various electrical circuits of the vehicle to provide overload and short circuit protection therefor. Almost everyone is familiar with the glass barrel type fuses commonly used in the automotive industry. During the last several years, a new blade type fuse with a plastic body has been introduced and is now being used to replace the barrel type fuse on most all car lines. As these fuse blocks are not generally considered to be stylish, they are oftentimes placed in concealed locations, i.e. such as under the dash, which greatly limits their accessibility. As a result, when a fuse blows it can be quite inconvenient to remove the blown fuse and replace it with a new fuse. This is caused not only by the awkward location of the fuse block, but also by the small size of the fuse, and the relatively high contact pressure required to ensure reliable circuit operation in a low voltage, low amperage application.

There are presently available in the prior art several different kinds of devices suitable for inserting and removing barrel type fuses. One of these includes a one piece molded plastic tool with jaws on either end of the tool and a sliding metal clamp along the handle. The tool is used by clipping the plastic jaws over the barrel of a fuse, sliding the clamp down around the jaws to more firmly position them, and then pulling on the handle to remove the fuse. As can be appeciated, performing these steps can be somewhat inconvenient and time consuming when the fuse block is awkwardly positioned. Furthermore, there is always the danger of shattering the glass barrel of the fuse. Also, the tool does not function with the newer design blade type fuse.

Another tool in the prior art has a pair of opposing metal jaw members mounted in a plastic handle such that they may be opened or closed by rotating the handle with respect to the jaws. This tool is used by first positioning the jaws adjacent the barrel of the fuse, rotating the handle to tighten the jaws about the fuse (the barrel of the fuse restricting rotation of the jaws), and then pulling the tool to remove the fuse. This is also a somewhat complicated tool which can be quite expensive for the limited usefulness of a fuse puller. Furthermore, there is a normal reluctance to point metal jaws at an electrical device and use the jaws to work on an electrically hot device. As with the other tool, the fuse is removed by grasping the glass barrel near its midpoint which requires the user to overcome the spring force at both ends of the fuse and can result in breakage of the glass tube. After a glass tube is broken, it can be quite difficult to then remove the end caps of the fuse from between the jaws of the spring fuse clip.

To solve these and other problems, applicant has succeeded in developing a one piece molded plastic tool which can be used with either blade type or barrel type fuses, and which can remove and install either type easily and efficiently with lessened danger of breakage. The central or handle portion of the fuse puller is generally elongated and can be shaped to adapt to the hand of the user. At one end of the fuse tool, a pair of flexible tines extend in a generally colinear fashion and in opposition to each other, each tine having a barb with a beveled surface at the hand of the barb. Each barb extends inwardly somewhat to form a shelflike projection or tab which is adapted to rest against the lower surface of the raised shoulder on the hand of a blade type fuse. A stem extends generally colinearly with the handle and between the tines so that the head of the blade type fuse can be captured between the stem and tines. The tines are sufficiently resilient to press snap onto the enlarged head of a blade type fuse as it is inserted into its fuse clip, with the tablike projections of the barbs catching underneath the fuse's raised shoulder. A fuse may then simply be removed by withdrawing the tool and fuse from the fuse block. The tool may be used to insert a blade type fuse by sliding the head of the fuse sideways between the tines and stem and then reversing the procedure. Once the fuse is installed, the tool may be removed by a rocking motion to individually separate each tine from the fuse, or by sliding the tool sideways with respect to the fuse. The top surface of the stem is generally concave such that the barrel of a barrel type fuse can be pushed in between the tines and be captured between the tines and the stem to facilitate the insertion of the fuse into its fuse clip. As the flexibility of the tines is greater than the spring type fuse clip, the tool may be easily separated from the fuse without danger of damage to the glass type barrel.

As can be appreciated, all these above described functions can be achieved with the structure as shown at one end of the tool. These functions include both inserting and removing a blade type fuse and the insertion of a barrel type fuse. To aid in the removal of a barrel type fuse, the other end of the tool has a hooklike projection which can be molded right into the one piece tool. The hooklike projection is generally flattened so that it will fit down between the barrel of the fuse and the surrounding fuse block, pivoted 90° underneath an end of the fuse, and then lifted or pulled away from the fuse block to remove only one end of the fuse. As can be appreciated, this requires substantially less effort than grasping the barrel type fuse closer to the center of its barrel as only one set of fuse clips need be separated to remove one end of the fuse. Once that end of the fuse is removed, the user may then simply grasp the exposed fuse end with his fingers and easily remove the other end with a lever type motion. Thus, with applicant's tool, either a barrel type and blade type fuse may be inserted and remove in a quick and easy manner. Furthermore, applicant's one piece tool may be injection molded in a single piece construction of a non-conductive material, such as a polycarbonate plastic, which greatly reduces the cost of manufacture. Further advantages and features of applicant's invention may be learned by reviewing the drawings and reading the description of the preferred embodiment which follows.

BRIEF DESCRIPTION OF THE DRAWINGS

FIG. 1 is a perspective view of applicant's one piece tool;

FIG. 2 is a partial cross-section of one end of the tool snapped over the head of a blade type fuse inserted in its fuse clip; and FIG. 3 is a partial view of an end of applicant's tool with the barrel of a barrel type fuse captured between the tines and stem thereof.

DETAILED DESCRIPTION OF THE PREFERRED EMBODIMENT

Applicant's fuse puller 20 includes a generally elongated handle portion 22 with a blade fuse fixture 24 at one end and a hook like barrel fuse remover 26 at the other end. The entire fuse puller 20 may be injection molded from a polycarbonate plastic compound such that the entire tool is formed in one piece with no assembly required.

The blade fuse fixture 24 is shown in greater detail in FIG. 2 and includes a pair of tines 28 which are generally colinear with the handle portion 22 and which extend generally parallel and in opposition to each other. Each tine 28 has a barb 30 at its end, each barb 30 having a beveled surface 32 extending inwardly from the lower tip of the barb 30 and terminating in a shelf like projection or tab 34. Tab 34 has a generally flattened surface 36 which is aligned to engage the generally flattened surface 38 of the upraised shoulder 40 surrounding the enlarged head 42 of a typical blade type fuse 44. The shoulder 45 of blade fuse fixture 24 provides a convenient place to grip the tool 20 to aid removal of barrel type fuses, as explained below. As is shown in phantom in FIG. 2, blade type fuse 44 has a pair of blade type projections 46 which are inserted between the jaws 48 of a spring type fuse clip 50, with a bolt 52 or the like fastening the spring type fuse clip 50 to fuse block 54. The blade fuse fixture 24 also has a center stem 56 also generally coaxial with the handle portion 22, which projects outwardly between tines 28 such that the enlarged head 42 of a blade type fuse 44 can be captured between the tabs 34 of tines 28 and stem 56, as is shown in FIG. 2.

As is best shown in FIG. 3, center stem 56 has a concave platform 58 which matches the cylindrical shape of a barrel type fuse 60 to releasably hold same between the tabs 34 of tines 28 and platform 58.

As shown in FIG. 1, the hook like barrel fuse remover 26 includes a generally flattened post member 62 with a generally flattened head member 64 extending at a right angle thereto. A ledge 65 provides a sufficient handgrip for pulling out or inserting a blade type fuse, and also for inserting a barrel type fuse with the blade fuse fixture 24. The width of the hook like barrel fuse remover 26 is sufficiently small to permit its sliding insertion between the barrel fuse and its surrounding fuse block and a pivoting motion to bring the head member 64 beneath an end of the fuse. An upward pull on fuse puller 20, possibly gripped at shoulder 45, will then remove an end of the barrel type fuse from its spring clip, with removal completed through use of the hand.

OPERATION

The blade fuse fixture portion of the fuse puller can be used to insert or remove a blade type fuse, and to insert a barrel type fuse. To insert a blade type fuse, the head thereof may be inserted sideways between the tabs and stem, and the fuse press snapped into place as shown in FIG. 2, the stem pushing against the fuse head to drive it home. The fuse puller may then be removed by a rocking motion to separately disengage each tine from the head of the fuse, or by sliding the fuse puller sideways with respect to the fuse.

A blade type fuse may be removed by reversing the operation, except that the fuse puller may be directly press snapped onto the blade type fuse because of the beveled surface of the tabs which separate the tines as they are forced against the head of the fuse. Once secured to the head of the fuse, the fuse puller may be simply pulled to retract the fuse from between the fuse clips, and the fuse slid sideways to separate it from the tool.

The blade fuse fixture may also be used to insert a barrel type fuse by releasably snapping the barrel type fuse against the platform of the stem, as shown in FIG. 3. The tabs of the tines releasably hold the barrel of the fuse against the platform while permitting the ends of the barrel type fuse to be exposed for insertion into the fuse clips. The barrel type fuse may be pushed into the fuse clips, and as the tines are more flexible than the fuse clip, they will release as the fuse puller is withdrawn. Use of the hook-like barrel fuse end of the fuse puller has been described above.

Various changes and modifications may be made to applicant's device as would be apparent to those skilled in the art. These changes and modifications are included in applicant's teaching and his invention is limited only by the scope of the claims appended hereto.

I claim:

1. A tool to facilitate the insertion and removal of at least a blade-type fuse from a spring clip receptacle, the fuse having an enlarged head with a raised shoulder surrounding same, said shoulder having a generally flattened lower surface, said tool comprising a generally elongated handle portion for grasping the tool during use, and a pair of resilient, opposing tines depending generally colinearly from the handle, said tines having means to positively engage the lower surface of the shoulder on generally opposite sides of the fuse, the tines being resilient and having a beveled surface on the end of each tine for resiliently separating the tines as the beveled surface of the tines are forced against the fuse head, the tines resiliently snapping back after the beveled surface clears the shoulder thereby bringing the shoulder engaging means into contact with the lower surface of the shoulder, the tool being thereby attached to an inserted fuse for removal thereof, and a stem depending generally colinearly between the tines to engage the top of the fuse head so that the large fuse head may be captured between the tines and the stem during use of the tool.

2. The tool of claim 1 wherein the shoulder engaging means comprises a barb substantially near the outer end of each tine, each barb having a substantially flattened surface aligned to engage the lower surface of the fuse shoulder.

3. The tool of claim 1 wherein the shoulder engaging means includes a barb substantially near each end of each tine, each beveled surface forming part of each barb.

4. The tool of claims 2 or 3 being further adapted for use with a barrel type fuse as well and wherein the stem has a concave surface adapted to receive the barrel of a barrel type fuse, the barbs having inward projections adapted to releasably capture the barrel against said concave surface to facilitate insertion of the fuse into a spring type fuse clip.

5. The tool of claim 4 wherein the tool is a one piece molded polycarbonate device, said polycarbonate being non-conductive.

6. The tool of claim 1 being further adapted for use with a barrel type fuse as well and further comprising means extending from the end of the handle portion opposite the tines to facilitate the removal of a barrel type fuse.

7. The tool of claim 6 wherein the barrel fuse removal means comprises a hook extending generally colinearly from the handle portion, said hook adapted for engagement with an end of an inserted barrel type fuse.

8. The device of claim 1 further comprising means to release the tool from an inserted blade fuse by a rocking motion.

9. A tool to facilitate the insertion and removal of either a blade type fuse or a barrel type fuse from its spring clip receptacle, the blade type fuse having an enlarged head with a raised shoulder surrounding the same, said shoulder having a generally flattened lower surface, said tool comprising a generally elongated handle portion for grasping the tool during use, a fuse fixture at one end, and a hook fixture at the other end of said handle portion, the fuse fixture having a pair of opposing tines and a stem extending therebetween, each tine having a barb at its end to engage the upraised shoulder of the blade type fuse and capture it against the stem, the tines being sufficiently flexible to press snap onto the head of an inserted blade type fuse and positively engage the lower surface of the shoulder.

10. The tool of claim 9 wherein the hook fixture includes a generally flattened hook like projection, and the stem has a generally concave surface.

11. The tool of claim 7 or 10 further comprising a ledge formed substantially near the hook fixture to aid in gripping said tool during use of the fuse fixture.

12. The tool of claim 11 wherein the fuse fixture has a shoulder to aid in gripping said tool during use of the hook fixture.

* * * * *